(12) United States Patent
Ness et al.

(10) Patent No.: US 6,327,286 B1
(45) Date of Patent: *Dec. 4, 2001

(54) HIGH SPEED MAGNETIC MODULATOR VOLTAGE AND TEMPERATURE TIMING COMPENSATION CIRCUIT

(75) Inventors: Richard M. Ness, San Diego; William N. Partlo, Poway; Richard L. Sandstrom, Encinitas; David M. Johns, Lakeside, all of CA (US)

(73) Assignee: Cymer, Inc., San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/465,427

(22) Filed: Dec. 21, 1999

Related U.S. Application Data

(63) Continuation-in-part of application No. 09/069,019, filed on Apr. 27, 1998, now Pat. No. 6,016,325.

(51) Int. Cl.[7] .............................. H01S 3/00; H01S 3/10; H01S 3/04
(52) U.S. Cl. ........................ 372/38.02; 372/25; 372/34; 372/38.07; 372/38.1
(58) Field of Search .................................. 372/38, 34, 25

(56) References Cited

U.S. PATENT DOCUMENTS

| | | |
|---|---|---|
| 4,549,091 | 10/1985 | Fahlen et al. . |
| 5,138,622 | 8/1992 | Friede et al. . |
| 5,142,166 | 8/1992 | Birx . |
| 5,177,754 | 1/1993 | Ball et al. . |
| 5,309,462 | 5/1994 | Taylor et al. . |
| 5,313,481 | 5/1994 | Cook et al. . |
| 5,319,665 | 6/1994 | Birx . |
| 5,359,279 | 10/1994 | Gidon et al. . |
| 5,514,918 | 5/1996 | Inatomi et al. . |
| 6,016,325 | * 1/2000 | Ness et al. .............................. 372/38 |

OTHER PUBLICATIONS

J.V. Hill, et al., "Reliable, High Repetition Rate Thyratron Grid Driver Used with a Magnetic Modulator", 8th IEEE International Pulsed Power Conference, San Diego, CA, 1991, IEEE Catalog # 91CH3052–8.

W.S. Melville, "The use of Saturable Reactors as Discharge Devices for Pulse Generators," *Radio Section*, Paper No. 1034, pp. 185–207, Sep. 15, 1950.

Birx, et. al, "Basic Principles Governing the Design of Magnetic Switches," *Lawrence Livermore Laboratory Publication UCID–18831*, Nov. 18, 1980.

E.M. Lassiter, P.R. Johannessen, R.H. Spencer, "High –Power Pulse Generation Using Semiconductors and Magnetic Cores," AIEE Summer General Meeting, pp. 511–517, Nov. 1960.

H. Yanagise, et. al., "Solid–State Power Device for Excimer Laser," *Proceedings of the Joint Conference on Electronic Devices and Semiconductor Power Conversion*, Sep. 13, 1995.

Cymer ELS5600 Data, DOC. ID: ICLCACY00.EPS.

Yatsui, "Industrial application of pulse power and particle beams," Laser and Particle Beams (1989), vol. 7, part 4, pp. 733–741, Printed in Northern Ireland.

* cited by examiner

*Primary Examiner*—Teresa M. Arroyo
*Assistant Examiner*—James Menefee
(74) *Attorney, Agent, or Firm*—John R. Ross, Esq.

(57) ABSTRACT

An improvement over prior art voltage timing compensation circuits is achieved by incorporating a function generator to provide a more accurate non-linear compensation to pulse timing delay, which is typically a non-linear function of voltage. An improvement over prior art temperature timing compensation circuits is achieved by providing for actual temperature measurements to be made and used to drive the timing compensation circuitry for a more accurate temperature timing compensation than provided by prior art temperature synthesis, while still using a relatively simple compensating circuit. In some embodiments a timing compensation circuit combines both voltage and temperature timing compensation.

18 Claims, 14 Drawing Sheets

HIGH SPEED MAGNETIC MODULATOR VOLTAGE AND TEMPERATURE TIMING COMPENSATION CIRCUIT

This application is a continuation-in-part of Ser. No. 09/069,019, filed Apr. 27, 1998, now U.S. Pat. No. 6,016, 325.

FIELD OF THE INVENTION

The present invention relates generally to pulse power sources, particularly to an apparatus and method for controlling the pulse propagation delay and jitter in a magnetic modulator circuit, more particularly pertaining to excimer lasers and other gas discharge lasers.

BACKGROUND

The use of magnetic pulse compression circuits (magnetic modulators) to create high voltage, high current, short duration electrical pulses has been well described (see for example W. S. Melville, "The use of Saturable Reactors as Discharge Devices for Pulse Generators," *Radio Section*, Paper No. 1034, pp. 185–207, Sep. 15, 1950). Particularly, magnetic modulators have been applied advantageously to drive pulsed gas discharges for excimer lasers and other pulsed gas discharge lasers (see for example Ball et al. U.S. Pat. No. 5,177,754, Jan. 5, 1993.

Pulse propagation delay in a magnetic modulator depends upon the characteristic volt-second product(s) required to saturate the core(s) of the individual magnetic switch element(s). Since the volt-second product is nearly invariant for any individual core, operation at different voltage levels typically results in different pulse propagation or throughput delays relative to a trigger signal from master trigger (a shorter delay at higher voltages and a longer delay at lower voltages). However, in some applications, it is important to maintain a constant propagation delay, regardless of variable operating voltage levels, such that measurement events can be timed relative to a trigger signal from the master trigger. Jitter or variation in timing of the output pulse relative to th e trigger signal from the master trigger can also be important in these applications. Additionally, temperature fluctuations can lead to variations in propagation delay and/or jitter in timing of pulses.

Although circuit have been used previously to control pulse propagation delay and jitter in magnetic modulators, they have typically been complex, inflexible, and/or relatively crude and inaccurate in the compensation that they allow (see for example Hill et al. AReliable High Repetition Rate Thyratron Grid Driver Used with a Magnetic Modulator,@ 8th IEEE International Pulsed Power Conference, San Diego, Calif., 1991, IEEE Catalog #91CH3052-8).

A voltage timing compensation circuit in the prior art (see for example Cymer ELS5600 Data DOC. ID: ICLACY00.EPS) compensates for the delay variation at different voltages by adding a low level delay to a trigger signal from a master trigger when the magnetic modulator operates at higher voltages.

The prior art voltage timing compensation circuit operates by sampling the voltage of the initial operating stage of a magnetic modulator just prior to master trigger initiation. The sampled voltage is then digitized and used to drive a digital delay generator, which adds to the low level trigger signal a timing delay proportional to the sampled voltage. Thus according to the prior art cited above, delay compensation is linear relative to operating voltage, whereas the actual dependence of pulse propagation delay on voltage is non-linear.

Because the characteristic volt-second product of the magnetic switch element(s) is temperature dependent, some prior art implementations comprise a temperature timing compensation circuit to correct for variations in delay caused by fluctuations in operating temperature relative to a nominal design ambient temperature.

In accordance with certain prior art embodiments, this temperature timing compensation circuit comprises RC components that synthesize the approximate thermal characteristics of the system.

What is needed in the art is a simple, reliable circuit for timing compensation of a magnetic modulator that more accurately compensates for effects of voltage and/or temperature than does the prior art. Further needed in the art is a circuit for pulse timing control of a magnetic modulator in response to other independent variables, that is simple, accurate, and reliable.

SUMMARY

The present invention relates generally to pulse power sources, particularly to an apparatus and method for controlling the pulse propagation delay and jitter in a magnetic modulator circuit, more particularly pertaining to excimer lasers and other gas discharge lasers.

In some embodiments of the invention, improvement over prior art voltage timing compensation circuits is achieved by incorporating a function generator to provide a more accurate non-linear compensation to pulse timing delay, which is typically a non-linear function instead of a linear function of voltage.

In other embodiments of the invention, improvement over prior art temperature timing compensation circuits is achieved by providing for actual temperature, measurements to be made and used to drive the timing compensation circuitry for a more accurate temperature timing compensation than provided by the prior art temperature synthesis, while still using a relatively simple compensating circuit.

In further embodiments a very fast timing compensation circuit combines both voltage and temperature timing compensation without analog to digital conversion.

DETAILED DESCRIPTION OF THE EMBODIMENTS

The present invention relates generally to pulse power sources, particularly to an apparatus and method for controlling the pulse propagation delay and jitter in a magnetic modulator circuit, more particularly pertaining to excimer lasers and other gas discharge lasers.

Figure 1:
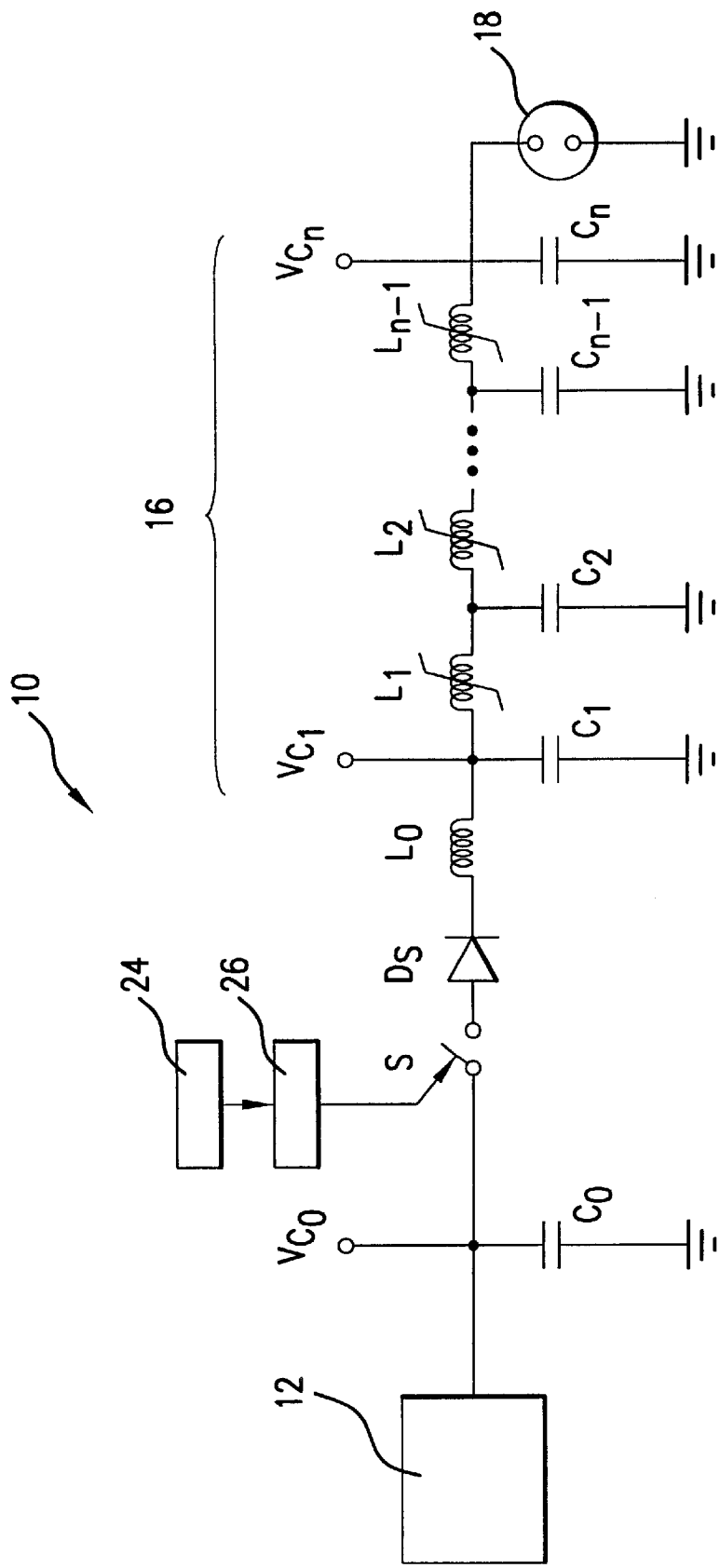
FIG. 1 is a simplified schematic diagram of a typical magnetic modulator circuit, familiar in the art.

FIG. 1 is a simplified schematic diagram of a typical magnetic modulator circuit 10 familiar in the art. (See for example Birx et al. U.S. application Ser. No. 08/739,873, filed Oct. 31, 1996, and Partlo et al. U.S. application Ser. No. 08/990,848 filed Dec. 15, 1997, which are incorporated herein by reference in their entirety.) Circuit 10 comprises a DC charging power supply 12, an initial operating stage capacitor $C_0$, a solid state triggered switch S, and a pulse compressor circuit 16 for compressing the duration and increasing the peak power of pulses applied to a load 18, typically a pulsed gas discharge such as an excimer laser.

Compressor circuit 16 comprises a ladder network of magnetic pulse compression stages containing banks of capacitors $C_1, C_2, \ldots C_{n-1}$ and $C_n$ and one or more magnetic switch elements represented by saturable inductors $L_1, L_2, \ldots, Ln_{n-1}$. Thus, a first saturable inductor $L_1$ is connected between capacitors $C_1$ and $C_2$, a second saturable inductor $L_2$ may be connected in series between capacitors $C_2$ and $C_3$, ..., and a saturable inductor $L_{n-1}$ is connected in series between $C_{n-1}$ and $C_n$.

Circuit 10 preferably further comprises a diode $D_S$, connected in series with triggered switch S to ensure that circuit 10 is nonconductive to reverse current. Illustratively circuit 10 further comprises an inductor $L_0$ selected in conjunction with capacitor $C_1$ to provide an LC time constant to slow the buildup of current through triggered switch S that could otherwise damage triggered switch S. Triggered switch S is typically interconnected with low level triggering circuitry familiar in the art, illustratively a trigger input circuit 24 and a switch trigger circuit 26.

In operation trigger input circuit 24 initiates a low-level trigger signal, which subsequently causes triggered switch S to close, discharging a power pulse from initial operating stage capacitor $C_0$, which has been charged to initial voltage $VC_0$ by charging power supply 12. The power pulse enters compressor circuit 16, where the pulse width is narrowed and the pulse amplitude is increased as the pulse propagates sequentially through the saturable inductors $L_1, L_2, \ldots, L_{n-1}$ of the ladder network of compressor circuit 16 into load 18.

The overall pulse propagation delay of a magnetic modulator consists of the low level switch trigger delay plus the sum of the individual pulse propagation delays through the magnetic pulse compression stages. Because pulse propagation in a magnetic modulator depends upon the relatively constant characteristic volt-second product(s) required to saturate the core(s) of the individual magnetic switch element(s), operation at different voltage levels typically results in different pulse propagation or throughput delays relative to trigger initiation by trigger input circuit 24 (a shorter delay at higher voltages and a longer delay at lower voltages).

Figure 2A:
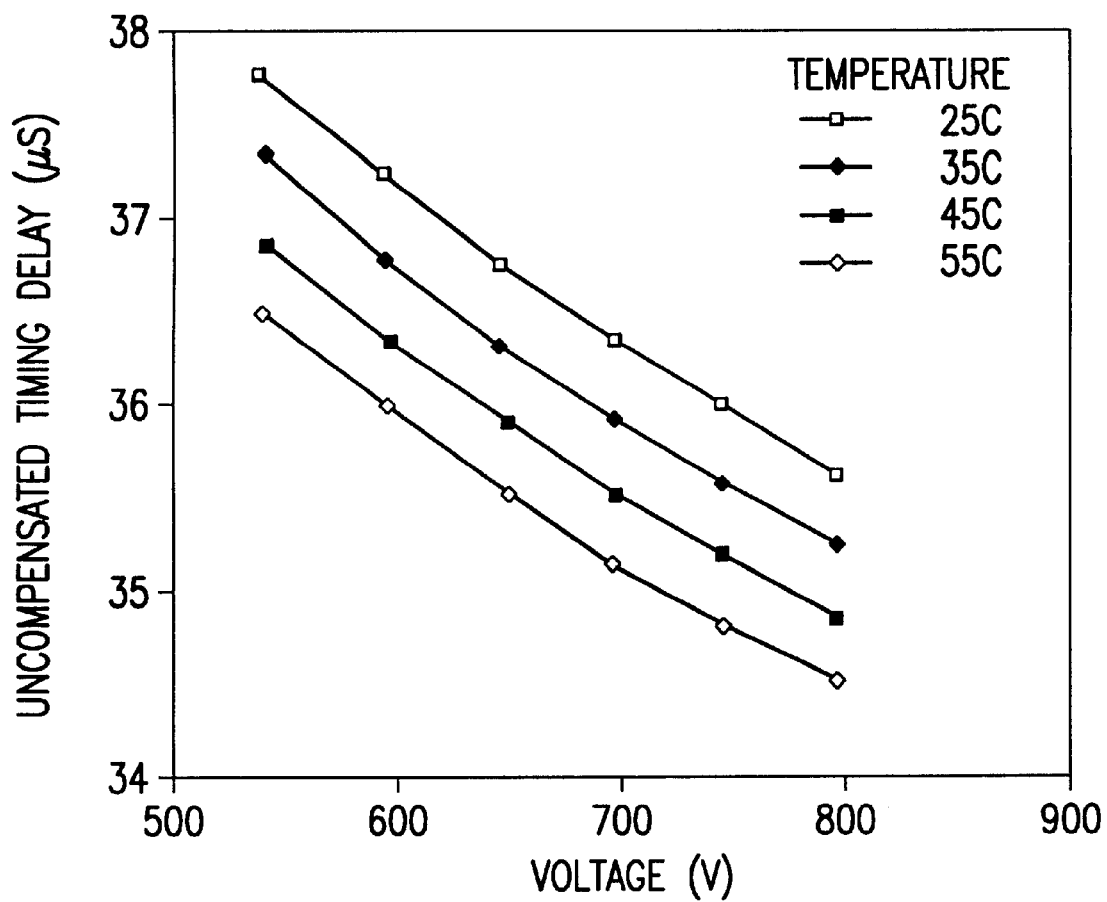
FIG. 2A is a graph showing the typical dependence of timing delay on voltage in a magnetic modulator without voltage timing compensation.

FIG. 2A is a graph showing the typical dependence of timing delay on voltage in a magnetic modulator without voltage timing compensation. The dependence is not linear, and the average variation of timing delay is about 2 $\mu$s over a voltage range from 550 volts to 800 volts at a fixed temperature. The graph indicates a dependence of timing delay on temperature of about 1.3 $\mu$s over a temperature range from 25 degrees C to 55 degrees C.

In some magnetic modulator applications, it is desirable to maintain a constant propagation delay, regardless of variable operating voltage level, such that measurement events can be timed relative to trigger initiation. Timing jitter or fluctuations in timing of the output pulse relative to trigger initiation can also be important in these applications.

Figure 2B:
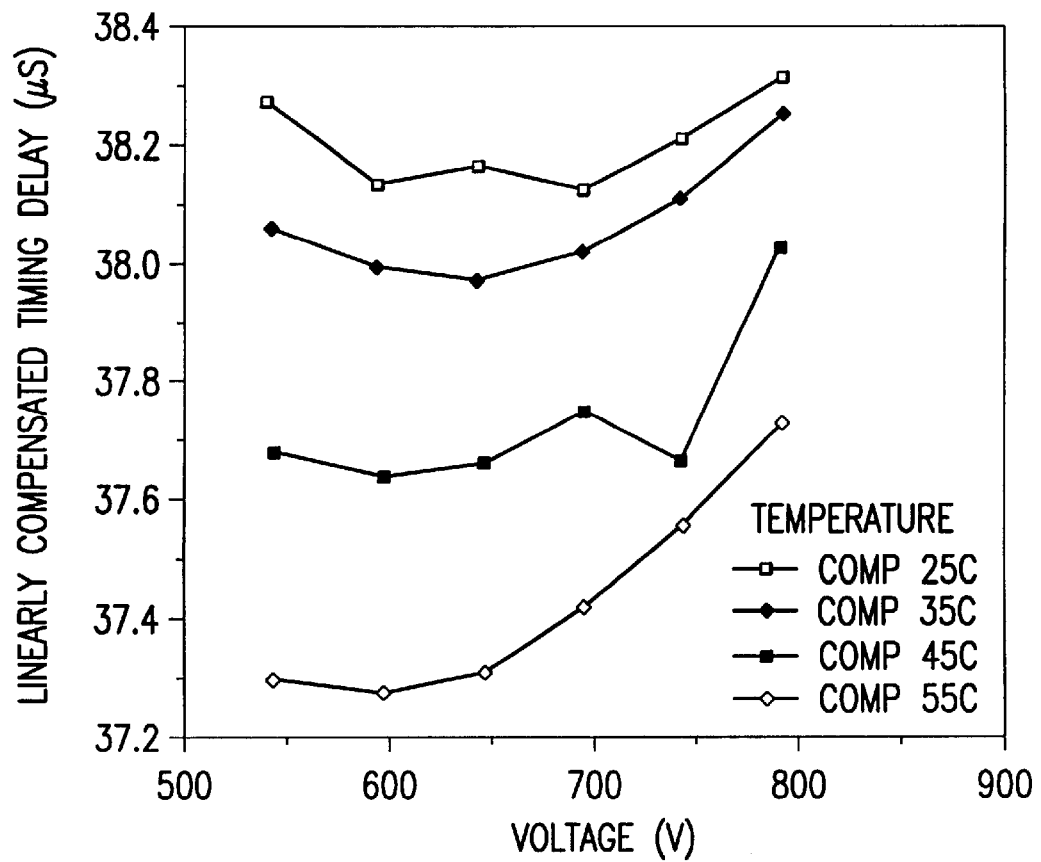
FIG. 2B is a graph showing the measured dependence of pulse timing delay on voltage for conventional linear voltage timing compensation, in accordance with the prior art.

FIG. 2B is a graph showing the measured dependence of pulse timing delay on voltage for a conventional linear voltage timing compensation circuit. Although the time delay variation is reduced relative to the uncompensated situation illustrated in FIG. 2A (note the change in vertical scale between FIGS. 2A and 2B), there is still substantial time delay variation with temperature and with voltage due to uncompensated non-linearity.

In accordance with the present invention, even though the sum of the propagation delays through the individual magnetic pulse compression stages of the magnetic modulator is shorter for operation at higher voltages, the overall propagation delay of the modulator is kept substantially constant by adding an accurately non-linear compensating delay to the low level switch trigger delay.

Figure 3:
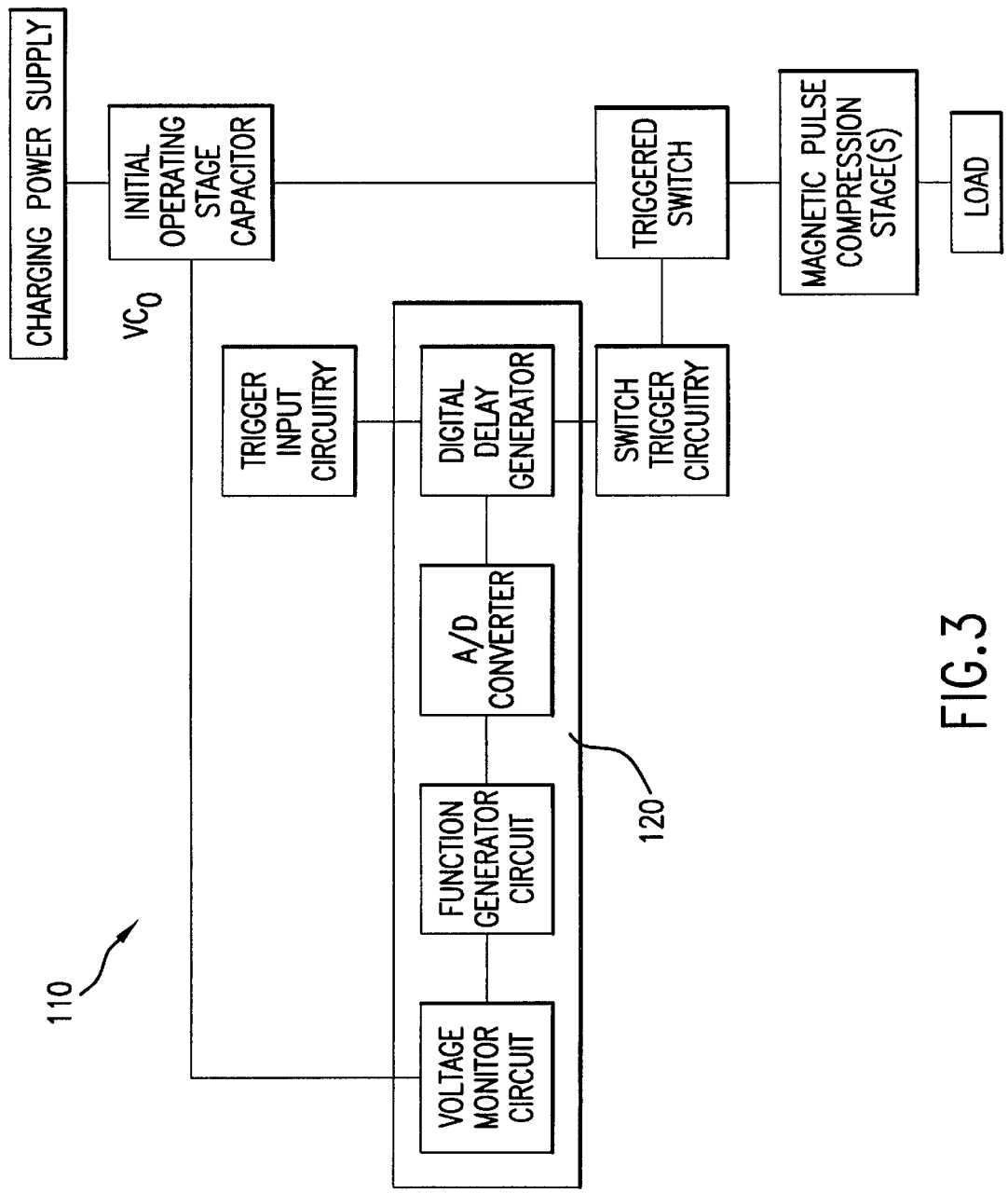
FIG. 3 is a block diagram of a magnetic modulator circuit incorporating a voltage timing compensation circuit, in accordance with the invention.

FIG. 3 is a block diagram of a magnetic modulator circuit 110 incorporating a voltage timing compensation circuit 120, in accordance with the invention. As with magnetic modulator circuit 10 (see FIG. 1), magnetic modulator circuit 110 contains a charging power supply connected to an initial operating stage capacitor, which in turn is interconnected to a load through a triggered switch and magnetic pulse compression stages. In some embodiments magnetic modulator circuit 110 may also contain one or more inductors (not shown for clarity) and one or more diodes (not shown for clarity) in series with the triggered switch. Additionally the triggered switch is interconnected with low level triggering circuitry familiar in the art, illustratively trigger input circuitry and switch trigger circuitry.

Voltage timing compensation circuit 120 of magnetic modulator circuit 110 contains a voltage monitor circuit having an input terminal connected to the high voltage terminal of the initial operating stage capacitor. The voltage monitor circuit comprises a voltage divider and/or other circuitry familiar in the art. The output terminal of the voltage monitor circuit is interconnected with the input terminal of a conventional analog/digital (A/D) converter through a function generator circuit. The output terminal of the A/D converter is in turn connected to the control terminal of a conventional digital delay generator, which is connected in series between the trigger input circuitry and the switch trigger circuitry of magnetic modulator circuit 110. The digital delay generator has an input terminal connected to the output terminal of the trigger input circuitry and an output terminal connected to the input terminal of the switch trigger circuitry.

In operation, voltage timing compensation circuit 120 samples the voltage $VC_0$ of the initial operating stage capacitor of magnetic modulator circuit 110, prior to trigger initiation by the trigger input circuitry. The sampled voltage is then processed, digitized, and applied to drive a digital delay generator, which adds to the low level trigger signal a timing compensation delay in response to the sampled voltage.

The voltage monitor circuit samples voltage $VC_0$ on the initial operating stage capacitor, while the triggered switch is open prior to the initiation of a low level trigger signal by the trigger input circuitry. The sampled voltage is subsequently applied to the function generator circuit, which performs non-linear compensation by generating a predetermined signal in response to the sampled voltage that more accurately represents the inverse of the actual non-linear delay versus voltage function (see FIG. 2A).

The output signal of the function generator is then applied to the A/D converter, where it is digitized and applied to drive the digital delay generator. The digital delay generator then adds to the low level trigger signal from the trigger input circuitry a timing compensation delay m response to the sampled voltage. The delayed trigger signal is then applied to the switch trigger circuitry, which closes the tiggered switch. Magnetic modulator circuit 110 then operates in a conventional manner.

Figure 4:
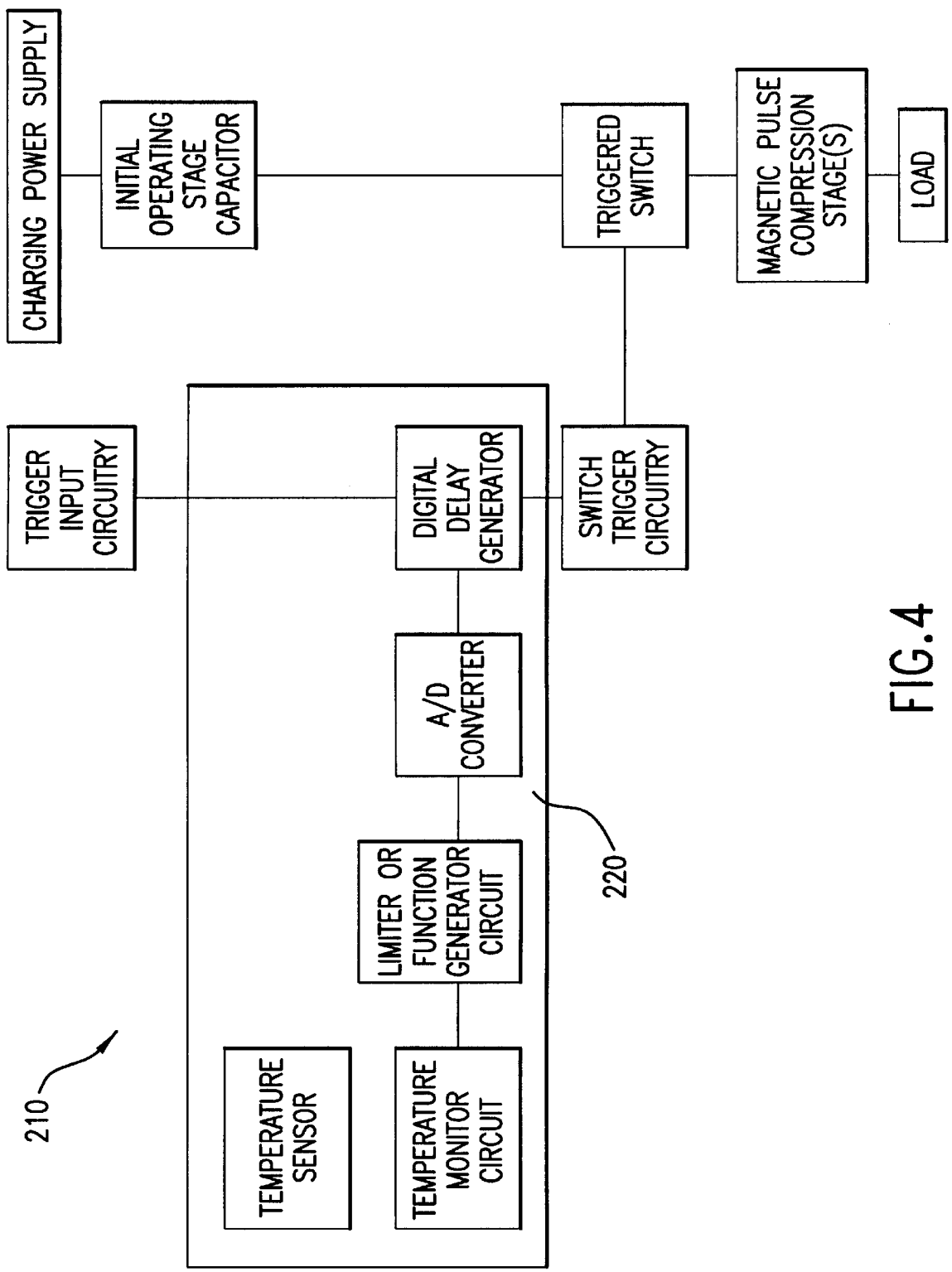
FIG. 4 is a block diagram of a magnetic modulator circuit incorporating a temperature timing compensation circuit, in accordance with the invention.

Because the characteristic volt-second product of magnetic switch element(s) is temperature dependent, some embodiments provide a temperature timing compensation circuit to correct for variations in delay caused by fluctuations in operating temperature relative to the nominal design ambient temperature. FIG. 4 is a block diagram of a magnetic modulator circuit 210 incorporating a temperature timing compensation circuit 220, in accordance with the invention.

As with magnetic modulator circuit 110 (see FIG. 3), magnetic modulator circuit 210 contains a charging power supply connected to an initial operating stage capacitor, which in turn is interconnected to a load through a triggered switch and magnetic pulse compression stages. In some embodiments, magnetic modulator circuit 210 may also contain one or more inductors (not shown for clarity) and one or more diodes (not shown) in series with the triggered switch. Additionally the triggered switch is interconnected with low level triggering circuitry familiar in the art, illustratively trigger input circuitry and switch trigger circuitry.

Temperature timing compensation circuit 220 of magnetic modulator circuit 210 contains a temperature monitor circuit having an input terminal connected to a conventional temperature sensor. The temperature monitor circuit comprises an impedance transformer, amplifier, comparator, and/or other circuitry familiar in the art.

The output terminal of the temperature monitor circuit is interconnected with the input terminal of a conventional A/D converter through an optional limiter or function generator circuit The output terminal of the A/D converter is in turn connected to the control terminal of a conventional digital delay generator, which is connected in series between the trigger input circuitry and the switch trigger circuitry of magnetic modulator circuit 210. The digital delay generator has an input terminal connected to the output terminal of the trigger input circuitry and an output terminal connected to the input terminal of the switch trigger circuitry.

In operation, temperature timing compensation circuit 220 senses a temperature and produces an input voltage. The input voltage is then digitized and applied to drive a digital delay generator, which adds to the low level trigger signal a timing delay compensating for the delay variation due to temperature change.

The temperature monitor circuit samples the output from the temperature sensor. The temperature monitor circuit then converts the sampled output to an amplified voltage, compares it with a reference voltage representing the nominal design temperature, and generates a difference voltage. The difference voltage is then applied from the output terminal of the temperature monitor circuit to the optional limiter or function generator circuit, where it is further processed and then applied to the input terminal of the A/D converter. In some embodiments the difference voltage is applied from the output terminal of the temperature monitor circuit directly to the input terminal of the A/D converter.

The input voltage to the A/D converter is digitized and is then applied to drive the digital delay generator. The digital delay generator then adds a timing delay to the low level trigger signal from the trigger input circuitry as in magnetic modulator 110. The delayed trigger signal is then applied to the switch trigger circuitry, which closes the triggered switch.

At temperatures below the nominal design temperature, typically no temperature compensation delay is added to the circuit. At and above the nominal design temperature, a magnetic switch typically saturates earlier than at lower temperatures, since the magnetic saturation flux density (i.e. the characteristic volt-second product) drops with increasing temperature. As a result, additional delay is added as the temperature increases, to compensate for the shorter saturation time (for a constant voltage).

In contrast with the prior art, actual temperature measurements are made and used to drive the timing compensation circuitry for a more accurate timing delay compensation, while still using a relatively simple compensating circuit.

Figure 5:
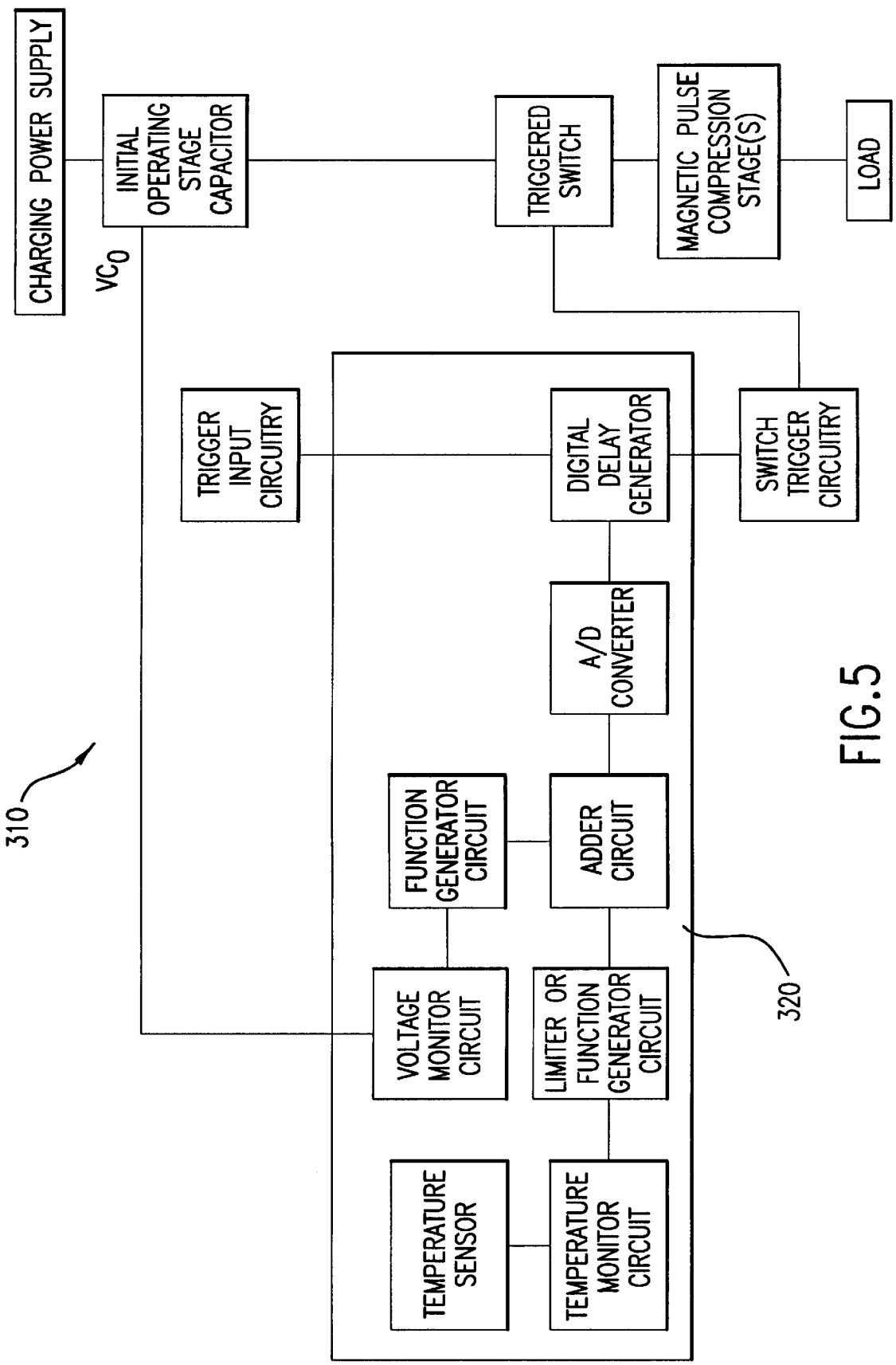
FIG. 5 is a block diagram of a magnetic modulator circuit incorporating a combined voltage and temperature timing compensation circuit, in accordance with the invention.

In further embodiments a timing compensation circuit comprises both voltage and temperature timing compensation. FIG. 5 is a block diagram of a magnetic modulator circuit 310 incorporating a combined voltage and temperature timing compensation circuit 320.

As with magnetic modulator circuits 110 and 210 (see FIGS. 3–4), magnetic modulator circuit 310 contains a charging power supply connected to an initial operating stage capacitor, which in turn is interconnected to a load through a triggered switch and magnetic pulse compression stages. In some embodiments magnetic modulator circuit 310 may also contain one or more inductors (not shown for clarity) and one or more diodes (not shown for clarity) in series with the triggered switch. Additionally, the triggered switch is interconnected with low level triggering circuitry familiar in the art, illustratively trigger input circuitry and switch trigger circuitry.

Voltage and temperature timing compensation circuit 320 of magnetic modulator circuit 310 contains a temperature monitor circuit having an input terminal connected to a conventional temperature sensor. The output terminal of the temperature monitor circuit is interconnected with an input terminal of an adder circuit through an optional limiter or function generator circuit.

Voltage and temperature timing compensation circuit 320 further contains a voltage monitor circuit having an input terminal connected to the high voltage terminal of initial operating stage capacitor. The output terminal of the voltage monitor circuit is interconnected with an input terminal of the adder circuit through a function generator circuit.

The output terminal of the adder circuit is connected to the input terminal of a conventional A/D converter. The output terminal of the A/D converter is in turn connected to the control terminal of a conventional digital delay generator, which is connected in series between the trigger input circuitry and the switch trigger circuitry of magnetic modulator circuit 310. The digital delay generator has an input terminal connected to the output terminal of the trigger input circuitry and an output terminal connected to the input terminal of the switch trigger circuitry.

In operation voltage and temperature timing compensation circuit 320 performs the combined functions of voltage timing compensation circuit 120 and temperature timing compensation circuit 220 (see FIGS. 3 and 4).

The temperature monitor circuit samples the output from the temperature sensor. The temperature monitor circuit then converts the sampled output to an amplified voltage, compares it with a reference voltage representing the nominal design temperature, and generates a difference voltage. The difference voltage is then applied from the output terminal of the temperature monitor circuit to the limiter or function generator circuit, where it is further processed and then applied to an input terminal of the adder circuit. In some embodiments the difference voltage is applied from the output terminal of the temperature monitor circuit directly to an input terminal of the adder circuit.

The voltage monitor circuit samples the voltage $VC_0$ on the initial operating stage capacitor, while the initial operating stage capacitor is charged and the triggered switch is open. The sampled voltage is applied from the output of the voltage monitor circuit to a function generator circuit, where it is further processed before applying to an input terminal of the adder circuit.

The adder circuit adds the processed output of the voltage monitor circuit to the output of the temperature monitor circuit (whether or not further processed by an optional limiter or function generator circuit), and applies the sum signal to the input terminal of the A/D converter, where it is digitized and applied to drive the digital delay generator. In some embodiments the outputs of the voltage monitor circuit and the temperature monitor circuit are individually digitized and are then added digitally to drive the digital delay generator. The digital delay generator then adds to the low level trigger signal from the trigger input circuitry a timing delay compensating for delay variation and jitter due to both voltage and temperature. The delayed trigger signal is then applied to the switch trigger circuitry, which closes the triggered switch.

Although the invention has been described in terms of embodiments in which timing compensation circuits sample temperature and/or voltage as independent variables and generate an appropriate trigger delay to actuate a magnetic modulator circuit, it will be recognized by those of ordinary skill in the art that the apparatus and methods taught herein can be applied to differing situations. For example, with simple modification other independent variables can be sampled either individually or in combination, and applied to generate a timing delay to control the timing of a device or system. Other independent variables include a range of environmental, condition, and process parameters.

In some applications, it may also be desirable to reduce the throughput time of the timing compensation circuitry. For example, at higher rep-rate operation, less time between pulses is available for charging the initial storage capacitor elements. Since it is desirable to maximize the time allowed for this charging, it is important to reduce the time required for generating the pulse. Because the timing compensation circuit requires additional time in the pulse generation period, anything that can be done to reduce this time allows more time for the charging circuit to operate. In the initial embodiment described in this document, a substantial fraction of the overall throughput delay is required by the timing compensation circuit and, more specifically, the A/D conversion process. Approximately 10–20 $\mu$s are required for this one step in the overall timing compensation. It would therefore be desirable to design a similar timing compensation circuit that would not require the A/D conversion process.

Figure 6:
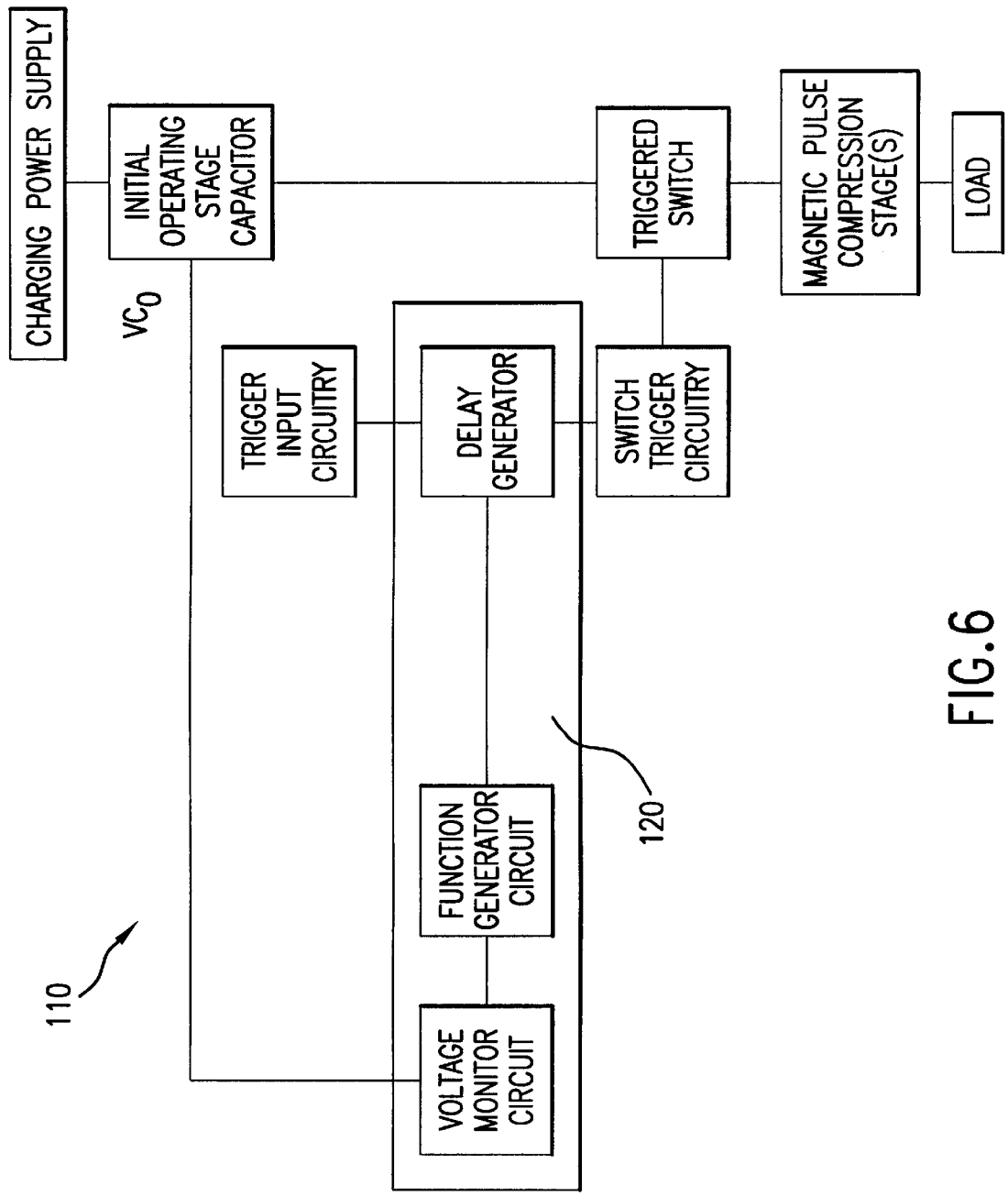
FIG. 6 is a block diagram of a magnetic modulator circuit incorporating a second embodiment of a voltage timing compensation circuit, in accordance with the invention.
Figure 7:
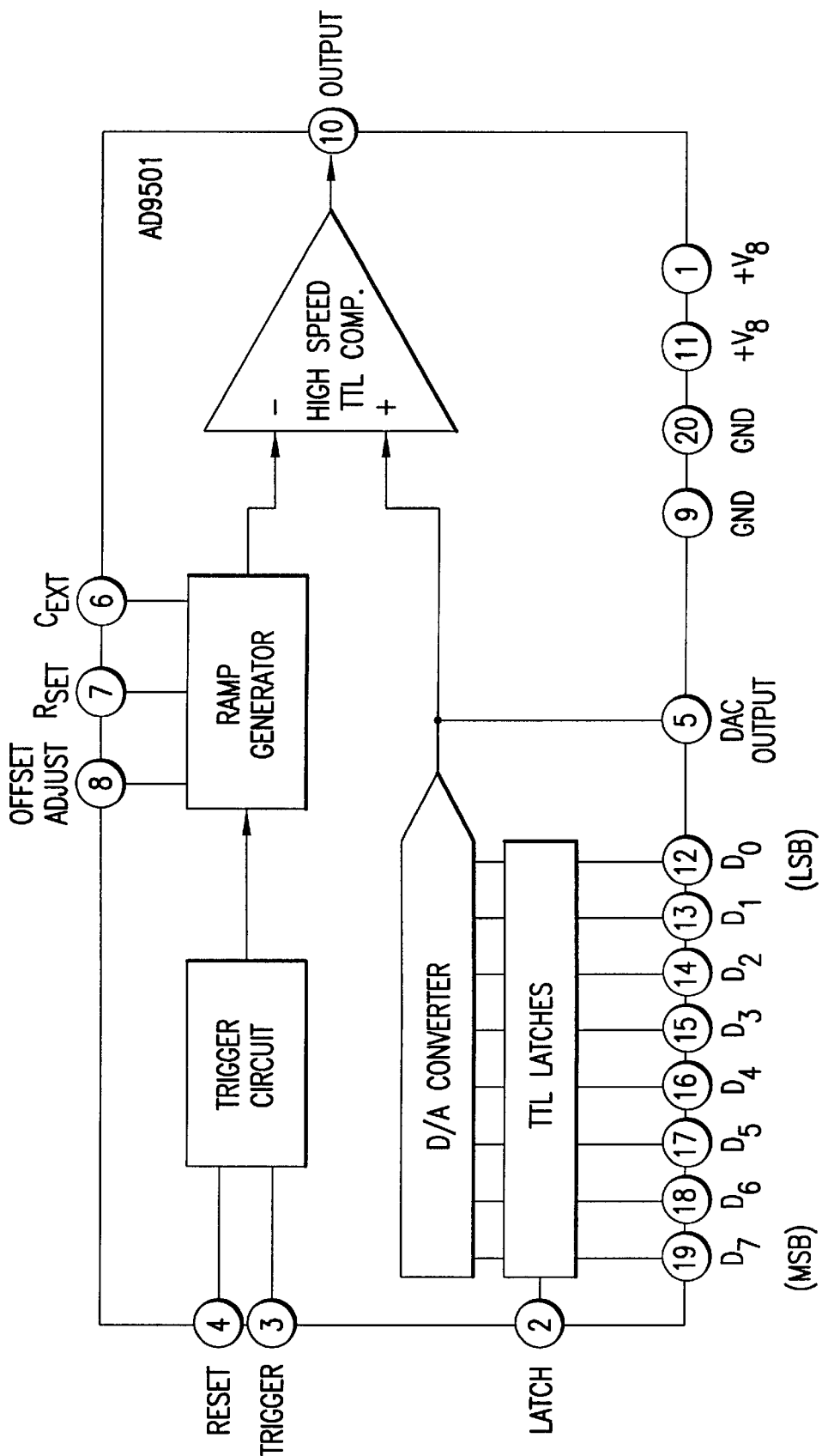
FIG. 7 is a pin-out diagram of the Analog Devices AD9501 Digitally Programmable Delay Generator integrated circuit.

A second embodiment of the proposed invention which does just that is shown in the block diagram of FIG. 6, which shows the second embodiment using a voltage compensation circuit. In this case, the A/D conversion step is eliminated and the analog signal from the function generator circuit is used to directly drive the digital delay generator. In this case, the Analog Devices AD9501 Digitally Programmable Delay Generator IC chip is used. As shown in FIG. 7, this specific IC chip has a pin (pin #5) available on the device for monitoring the D/A converter (DAC) output. Since this pin is also the analog input to the actual delay generator portion of the circuit, it can also be used as such. As a result, the timing compensation circuit can be implemented in such a way to reduce the throughput delay of the overall pulse generation by 10–20 $\mu$s.

Figure 8:
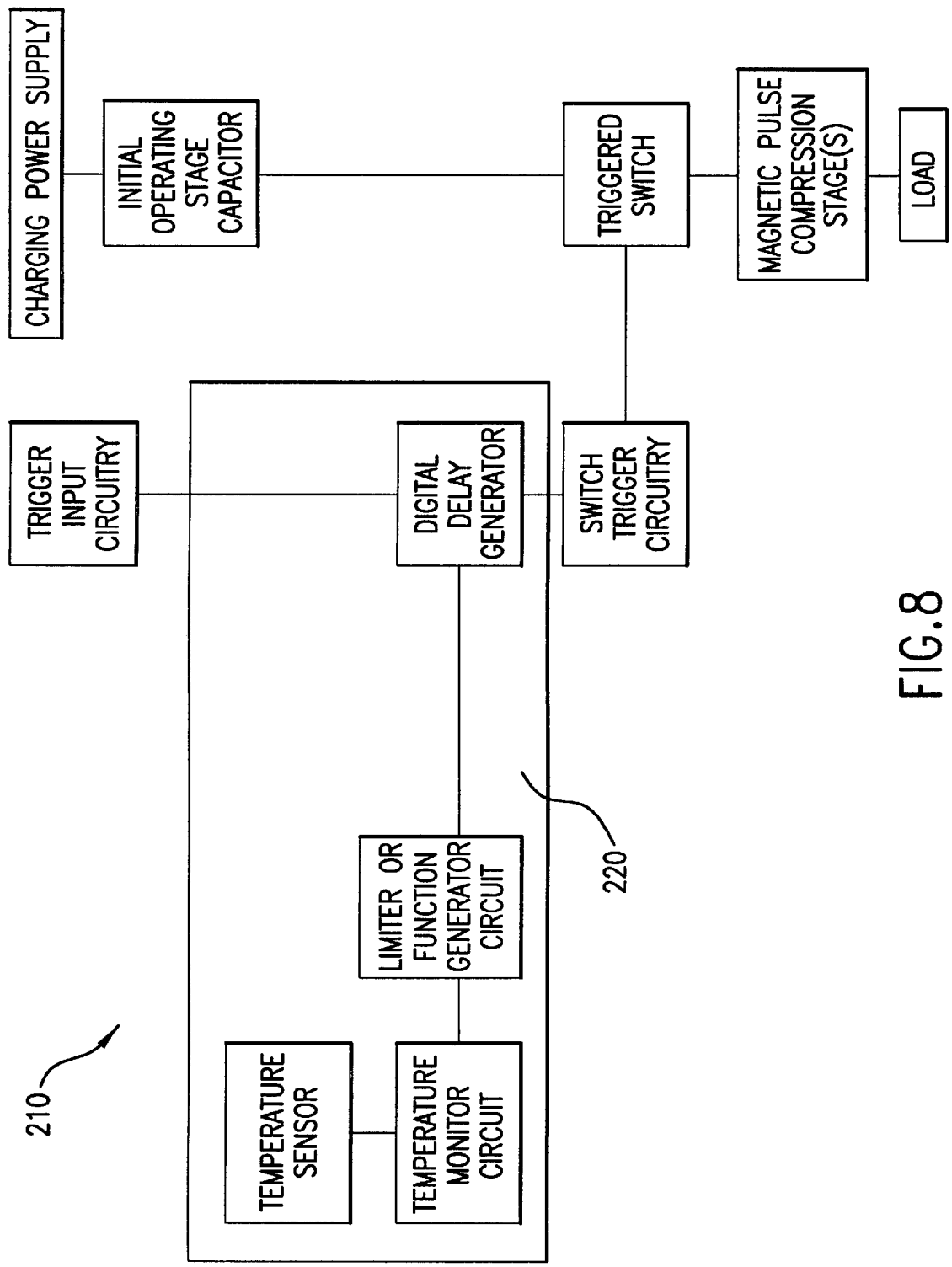
FIG. 8 is a block diagram of a magnetic modulator circuit incorporating a second embodiment of a temperature timing compensation circuit, in accordance with the invention.
Figure 9:
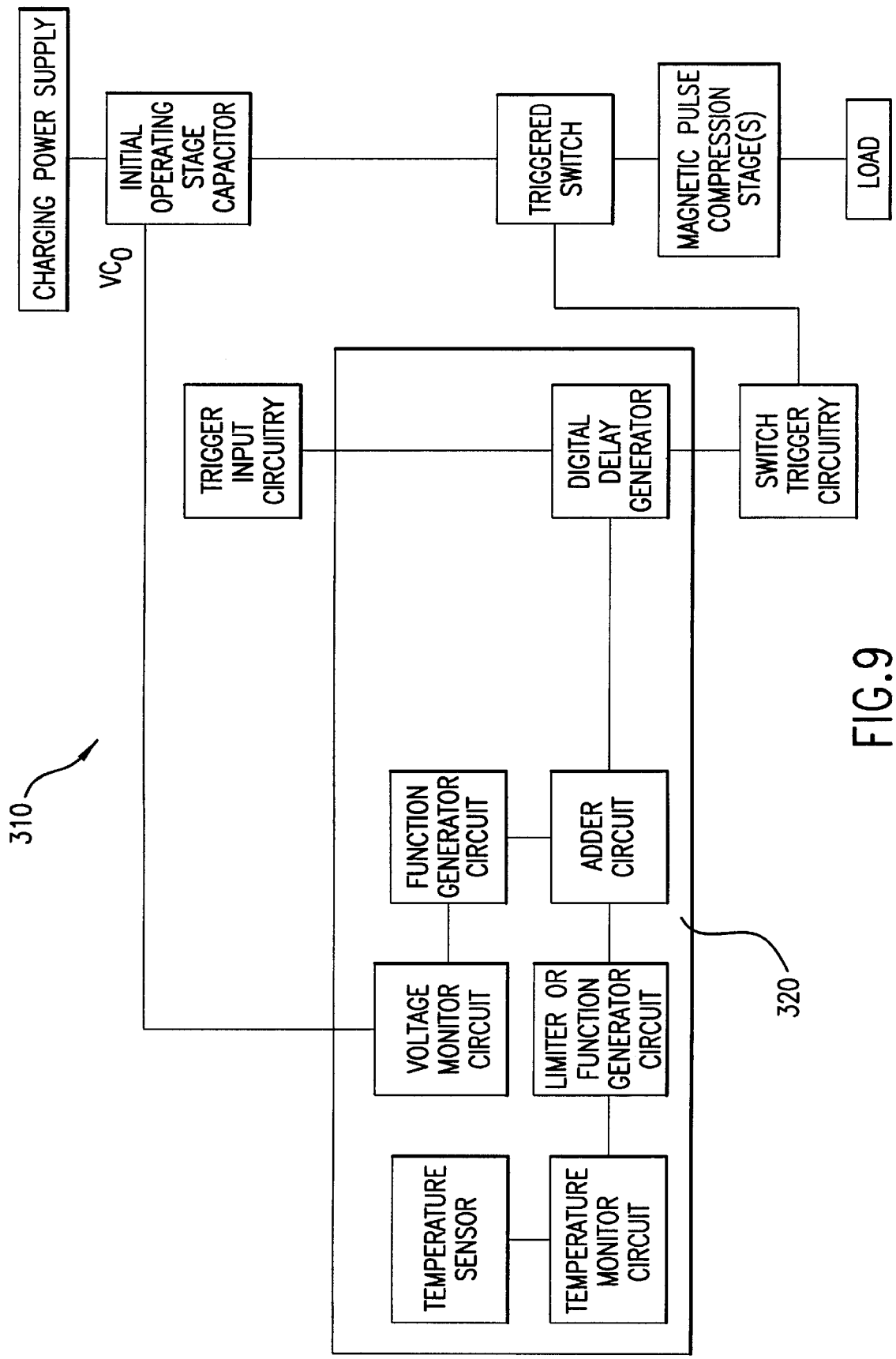
FIG. 9 is a block diagram of a magnetic modulator circuit incorporating a second embodiment of a combined voltage and temperature timing compensation circuit, in accordance with the invention.

FIG. 8 shows the block diagram of this second embodiment using a temperature compensation circuit and FIG. 9 shows the block diagram of this second embodiment using a voltage and temperature compensation circuit.

Figure 10:
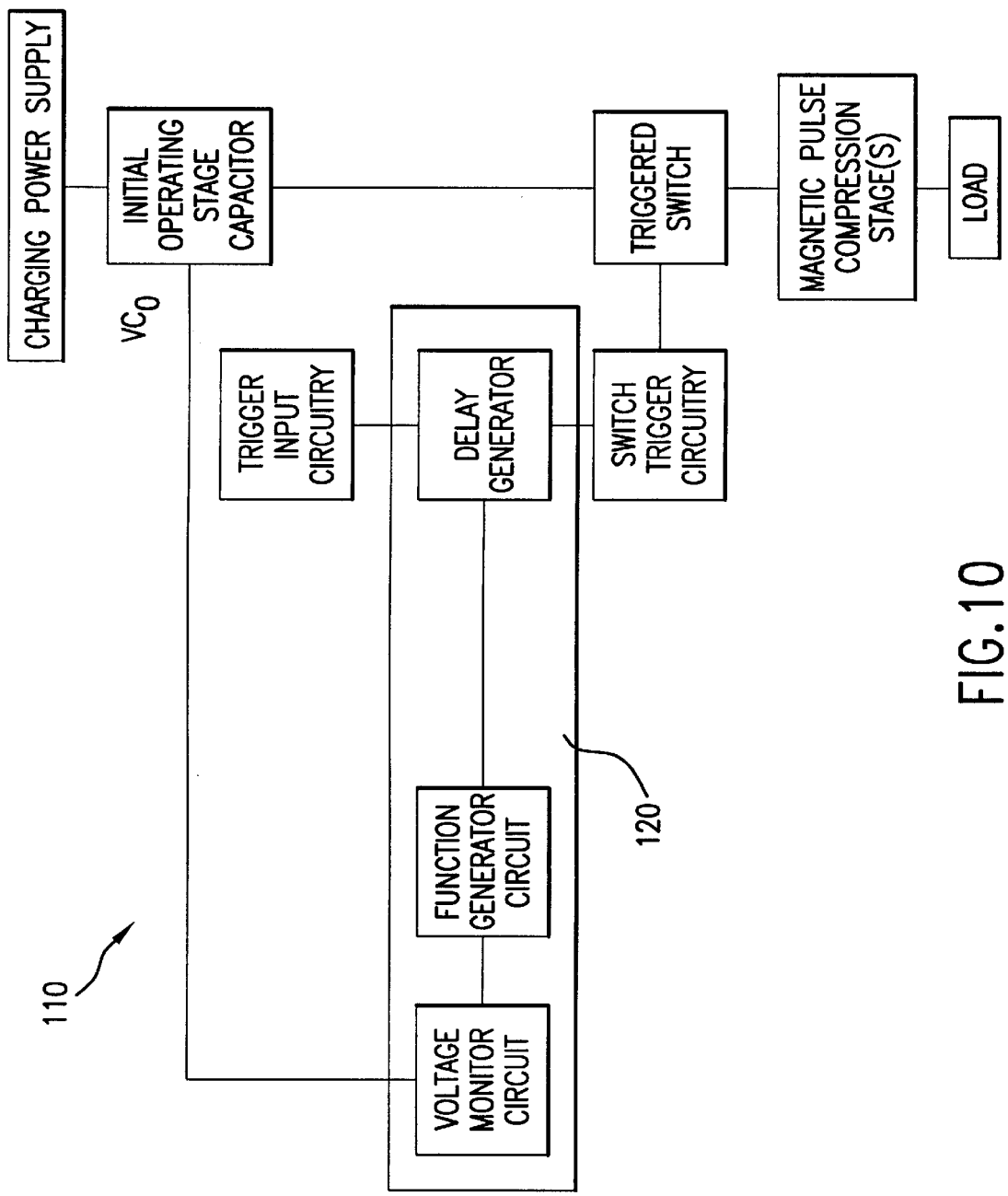
FIG. 10 is a block diagram of a magnetic modulator circuit incorporating a third embodiment of a voltage timing compensation circuit, in accordance with the invention.
Figure 11:
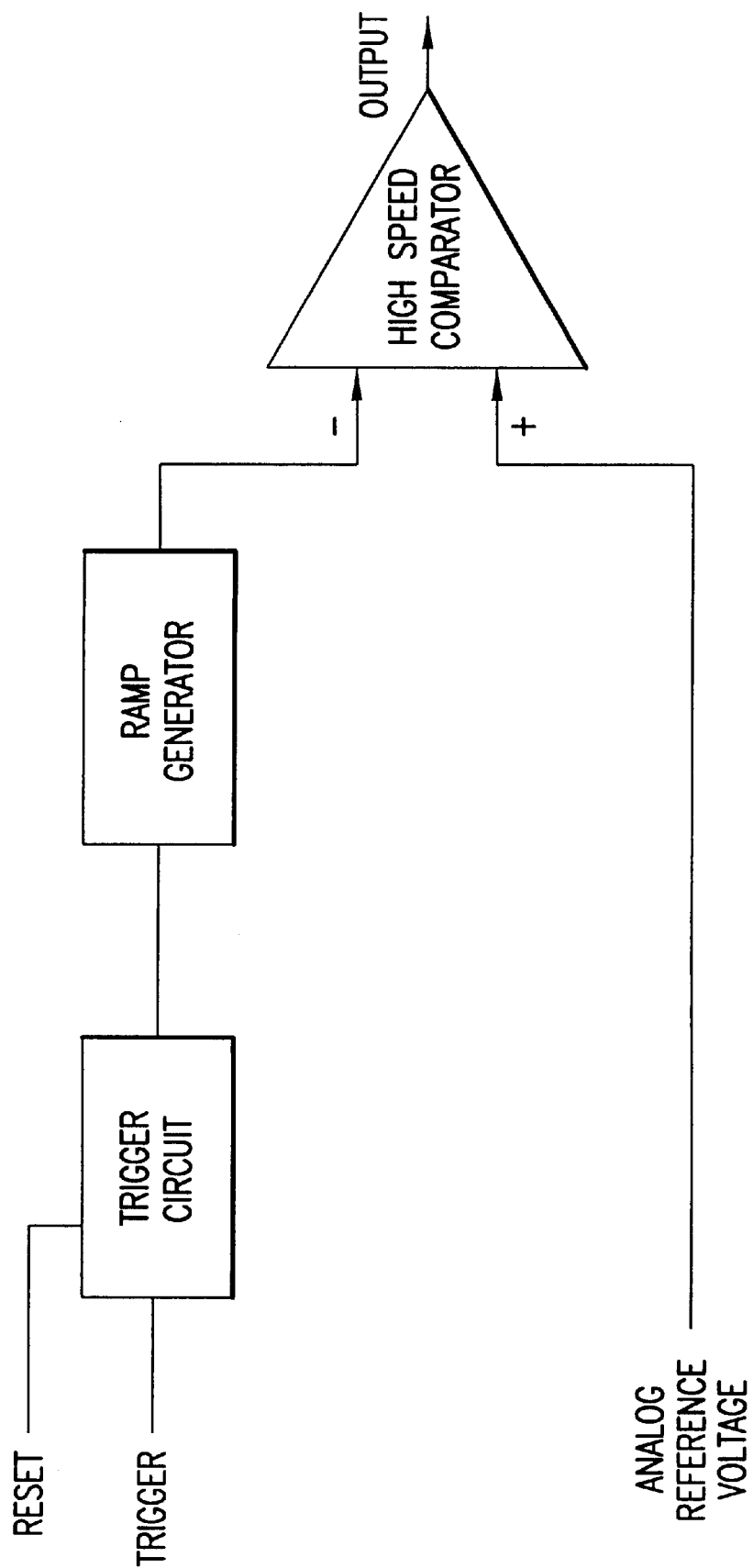
FIG. 11 is a block diagram of an analog delay generator circuit.

A third embodiment of the timing compensation circuit is shown in the block diagram in FIG. 10 for the voltage compensation circuit. In this case, the digital delay generator has been replaced by a discrete analog delay circuit previously implemented within the single IC chip. FIG. 11 shows the block diagram of this analog delay generator. When triggered, a ramp generator circuit generates an output analog voltage with a constant slope. Once the slope voltage crosses the analog delay reference voltage, the high speed comparator changes output state and the output pulse is generated. In this manner, the slope of the ramp and the analog reference voltage determine how long the delay is. This type of simple delay generator circuit is well known among those skilled in the art of analog electronics.

Figure 12:
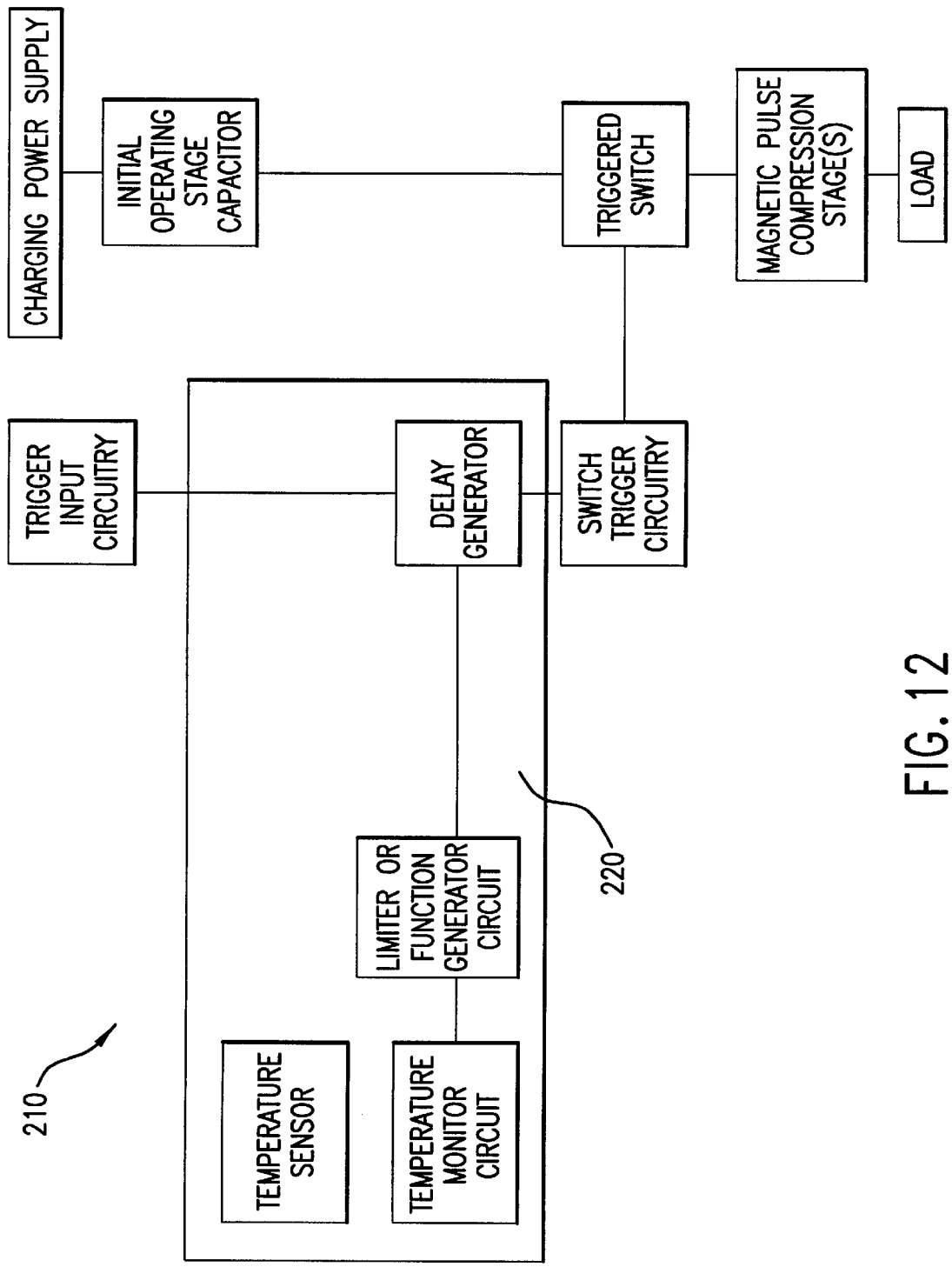
FIG. 12 is a block diagram of a magnetic modular circuit incorporating a third embodiment of a temperature timing compensation circuit, in accordance with the invention.
Figure 13:
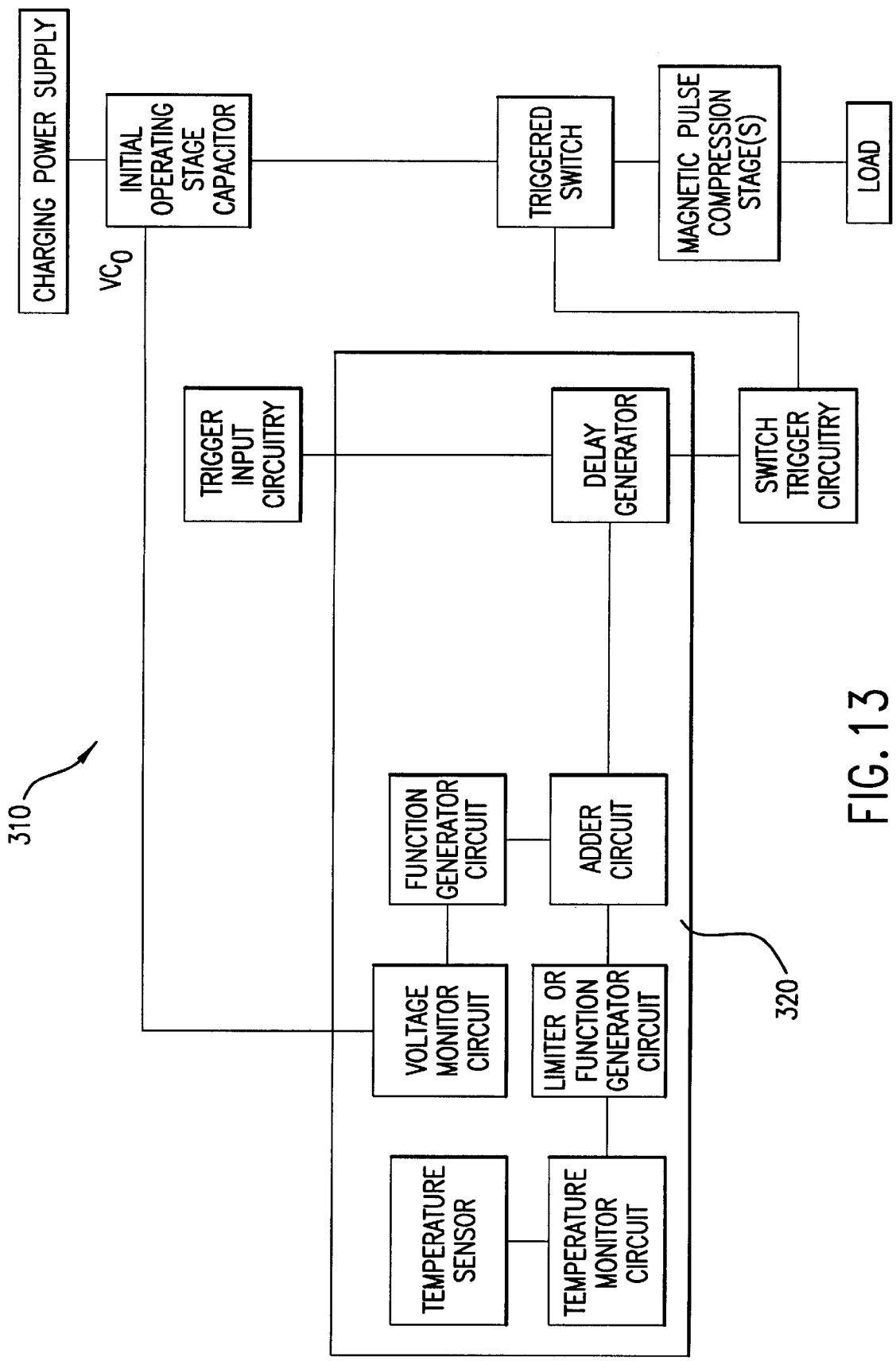
FIG. 13 is a block diagram of a magnetic modulator circuit incorporating a third embodiment of a combined voltage and temperature timing compensation circuit, in accordance with the invention.

FIG. 12 shows the block diagram of this third embodiment using a temperature compensation circuit and FIG. 13 shows the block diagram of this third embodiment using a voltage and temperature compensation circuit.

Although the invention has been described in terms of a certain preferred embodiment, other embodiments apparent to those skilled in the art are also within the scope of this invention. Accordingly, the scope of the invention is intended to be defined only by the claims which follow.

What is claimed is:

1. A circuit for pulse delay timing compensation of a magnetic modulator, comprising:
   a first monitor having a first monitor input terminal connected to a voltage probe interconnected with a terminal of an initial operating stage capacitor of said magnetic modulator and having a first monitor output terminal;

a timing delay generator having distinct first terminal, second terminal, and third terminal, said first terminal being connected to said first monitor output terminal, said second terminal being interconnected with a trigger input circuit, and said third terminal being interconnected with a triggered switch of said magnetic modulator; and a function generator interconnected between said first monitor output terminal and said delay generator.

2. The circuit according to claim 1, further comprising;

at least one second monitor different from said first monitor, said at least one second monitor having a second monitor input terminal connected to an input device and having a second monitor output terminal; and at least one adder circuit having an adder output terminal, a first adder input terminal, and a second adder input terminal different from said first adder input terminal, said first and second adder input terminals being interconnected with said function generator and said second monitor output terminals respectively, and said adder output terminal being connected to said tuning delay generator.

3. The circuit according to claim 2, wherein said input device comprises a temperature sensor.

4. The circuit according to claim 2, further comprising a signal processor interconnected between said second monitor output terminal and said second adder input terminal.

5. The circuit according to claim 4, wherein said signal processor is selected from the group consisting of a function generator and a limiter.

6. A circuit for pulse delay timing compensation of a magnetic modulator comprising:

a monitor having a monitor input terminal connected to an input device and having a monitor output terminal; and a digitizer connected to said monitor output terminal, said digitizer having a digitizer output terminal, and a timing delay generator having distinct first terminal, second terminal, and third terminal, said first terminal being connected to said digitizer output terminal, said second terminal being interconnected with a trigger input circuit, and said third terminal being interconnected with a triggered switch of said magnetic modulator.

7. The circuit according to claim 6, wherein said input device comprises a temperature sensor.

8. The circuit according to claim 6, further comprising a signal processor interconnected between said monitor output terminal and said timing delay generator.

9. The circuit according to claim 8, wherein said signal processor is selected from the group consisting of a function generator and a limiter.

10. A method of controlling pulse delay timing of a magnetic modulator having an initial operating stage capacitor interconnected in series with a triggered switch, comprising:

sampling a voltage at a terminal of said initial operating stage capacitor, while said triggered switch is open and said initial operating stage capacitor is charged;

generating a non-linear function in response to said sampled voltage;

generating a timing delay;

initiating a trigger signal;

adding said timing delay to said trigger signal to produce a delayed trigger signal; and applying said delayed trigger signal to close said triggered switch.

11. The method according to claim 10, wherein generating said timing delay further comprises:

sampling an independent variable;

generating a second voltage in response to said independent variable;

adding said second voltage to said non-linear function to produce a resultant voltage; and said timing delay being generated in response to said resultant voltage.

12. The method according to claim 11, wherein said independent variable is a temperature.

13. The method according to claim 12, further comprising signal processing said second voltage prior to adding said second voltage to said non-linear function.

14. The method according to claim 13, wherein said signal processing is selected from the group consisting of limiting and function generating.

15. A method of controlling pulse delay timing of a magnetic modulator having an initial operating stage capacitor interconnected in series with a triggered switch, comprising:

sampling an independent variable;

generating a voltage in response to said independent variable;

generating a timing delay;

initiating a trigger signal;

adding said timing delay to said trigger signal to produce a delayed trigger signal; and applying said delayed trigger signal to close said triggered switch.

16. The method according to claim 15, wherein said independent variable is a temperature.

17. The method according to claim 15, wherein generating said timing delay further comprises signal processing said voltage to produce a processed signal, said timing delay being generated in response to said processed signal.

18. The method according to claim 17, wherein said signal processing is selected from the group consisting of limiting and function generating.

* * * * *